United States Patent [19]

Nakatsugawa et al.

[11] Patent Number: 4,727,288
[45] Date of Patent: Feb. 23, 1988

[54] DIGITAL WAVE OBSERVATION APPARATUS

[75] Inventors: Kenji Nakatsugawa, Kanagawa; Aiichi Katayama, Isehara; Hitoshi Sekiya, Atsugi, all of Japan

[73] Assignee: Anritsu Corporation, Tokyo, Japan

[21] Appl. No.: 786,221

[22] Filed: Oct. 9, 1985

[30] Foreign Application Priority Data

Oct. 15, 1984 [JP] Japan .................................. 59-215863

[51] Int. Cl.4 ......................... H01J 23/34; H01J 29/98
[52] U.S. Cl. .......................................... 315/1; 315/3; 324/121 K; 340/733
[58] Field of Search ............... 315/1, 3; 340/730, 733, 340/734, 750; 324/77 R, 77 A, 121 R

[56] References Cited

U.S. PATENT DOCUMENTS

| | | | |
|---|---|---|---|
| 3,400,377 | 9/1968 | Lee | 340/733 |
| 3,701,988 | 10/1972 | Allaart | 340/733 |
| 3,706,906 | 12/1972 | Koussa et al. | 340/733 |
| 3,781,850 | 12/1973 | Gicca | 340/733 |
| 4,621,217 | 11/1986 | Saxe et al. | 315/1 |
| 4,642,519 | 2/1987 | Nakatsugawa et al. | 315/1 |

Primary Examiner—Saxfield Chatmon
Attorney, Agent, or Firm—Frishauf, Holtz, Goodman & Woodward

[57] ABSTRACT

Digital wave observation apparatus includes first and second A/D converters to convert input signals of first and second channels into corresponding first and second digital signals. First and second delay circuits selectively delay the first and second digital signals, and a wave memory stores signals output from the first and second delay circuits for purposes of display. A first command device receives channel designating data corresponding to the first channel and desired delay value setting data, and provides first delay data to a first delay value setting device coupled to the first delay circuit. A second command device receives designating data corresponding to the second channel and desired delay value setting data, and provides second delay data to the first delay value setting device and a second delay value setting device coupled to the second delay circuit.

6 Claims, 7 Drawing Figures

DIGITAL WAVE OBSERVATION APPARATUS

BACKGROUND OF THE INVENTION

The present invention relates to a digital wave observation apparatus and, more particularly, to a digital wave observation apparatus having a plurality of channels, wherein independent delay values of the respective channels can be simultaneously given, and at the same time the independent delay values can be simultaneously varied so as to translate the waves of the respective channels on a display screen along the time base.

A conventional digital wave observation apparatus, especially a digital oscilloscope with at least two channels, does not have a delay setting function in units of channels but only have a single common delay function or a completely independent channel delay function without a delay value varying function common in all channels.

In the conventional digital oscilloscope of the former type, delay differences between the channels cannot vary, and waves of the channels cannot be compared. In the conventional digital oscilloscope of the latter type, a delay value common in all channels cannot be set while relative delay differences between the channels are kept unchanged. A desired delay value is set channel by channel, and absolute delay is given to all channels. As a result, the relative delay differences between the channels tend to vary, thus resulting in inaccurate observation.

SUMMARY OF THE INVENTION

It is an object of the present invention to solve the conventional drawback described above and to provide a digital wave observation apparatus having both the function for setting independent delay values for a plurality of channels and the function for simultaneously changing the delay values of all the channels while the relative delay differences between the channels are kept unchanged, i.e., the function for giving absolute delay, thereby translating waves of all the channels on a display screen along the time base.

In order to achieve the above object of the present invention, there is provided a digital wave observation apparatus including A/D converters for converting input signals of a plurality of associated channels to digital signals, a plurality of delay circuits for delaying the digital signals, respectively, a plurality of delay value setting devices for setting delay values for outputs from the plurality of delay circuits, respectively, a first command device for receiving channel designating data corresponding to a first channel from delay channel designating means and desired delay value setting data from delay value setting means, and for supplying a first delay value command to a delay value setting device which corresponds to the first channel, thereby shifting the signal of the first channel by the first delay value; and a second command device for receiving channel designating data corresponding to a second channel from the delay channel designating means and desired delay value setting data from the dealy value setting means, and for supplying a second delay value command to a delay value setting device corresponding to the second channel and the delay value setting device which corresponds to the first channel, thereby shifting the signals of the second channel and the first channel by the second delay value while a relative delay between channels set by the first delay value is kept unchanged.

DETAILED DESCRIPTION OF THE PREFERRED EMBODIMENTS

Figure 1:
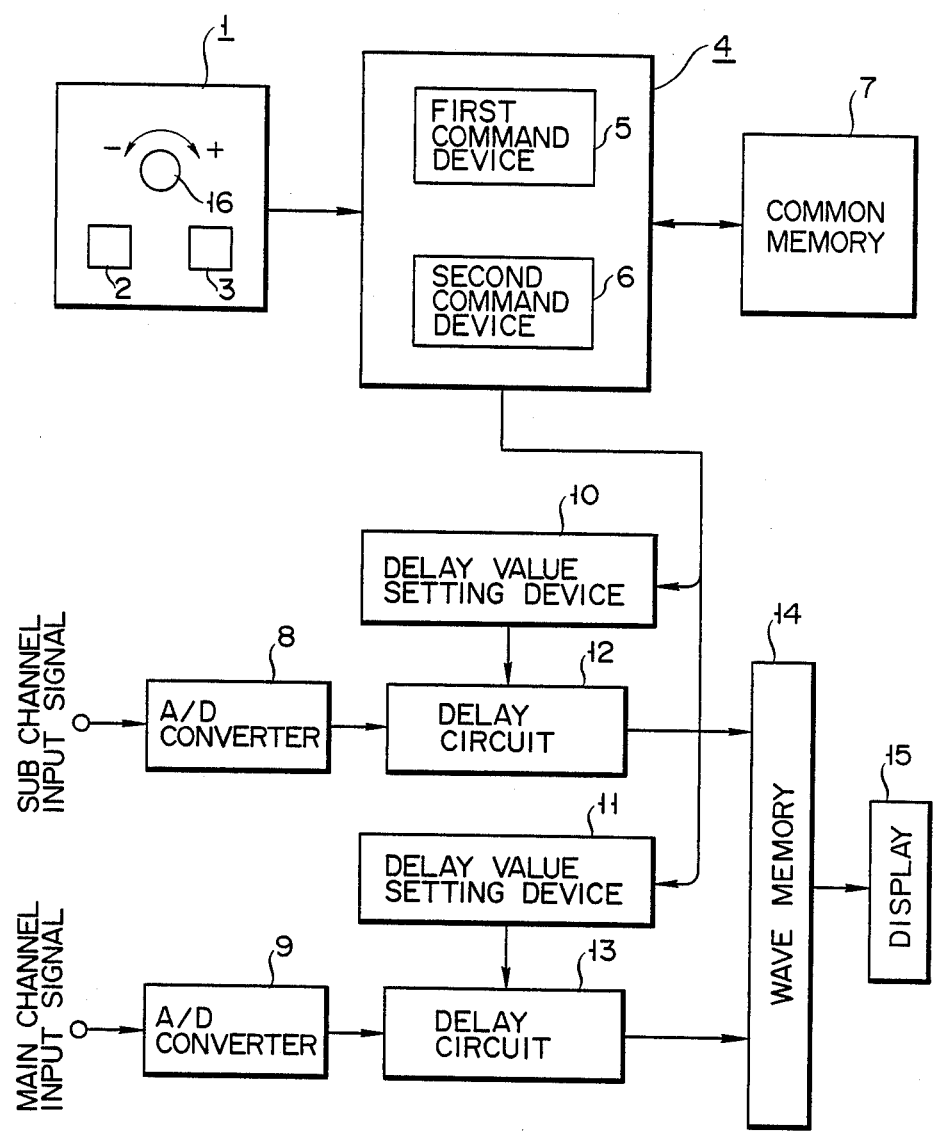
FIG. 1 is a block diagram of a digital wave observation apparatus according to an embodiment of the present invention.
Figure 2:
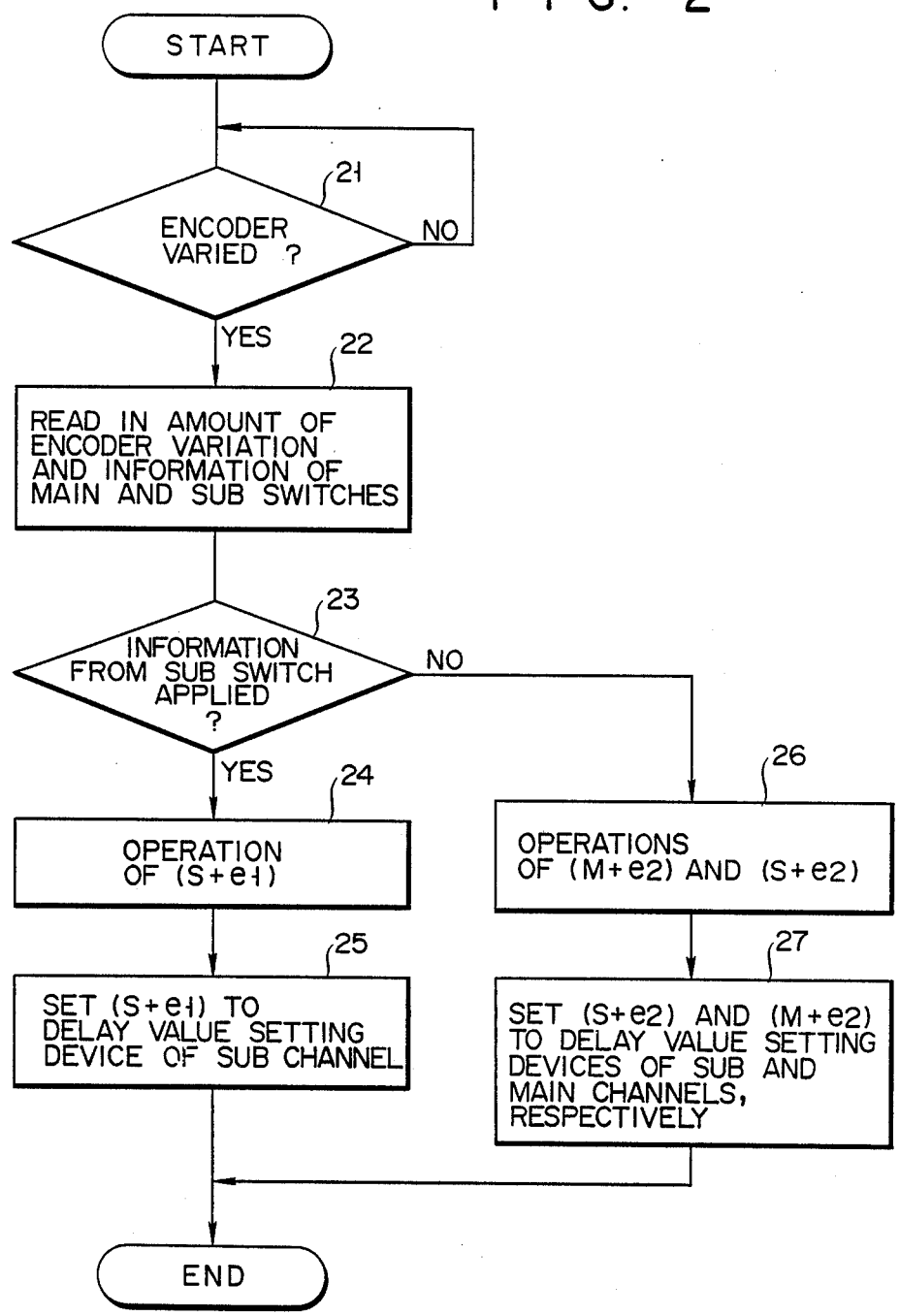
FIG. 2 is a flow chart for explaining the operation of the apparatus of FIG. 1.
Figure 3A:
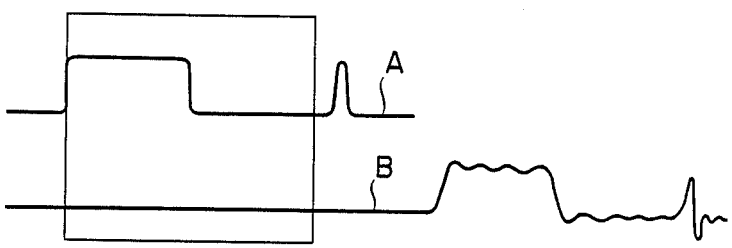
FIGS. 3(A) to 3(D) are respectively charts for explaining a wave translation along the time base.
Figure 3B:
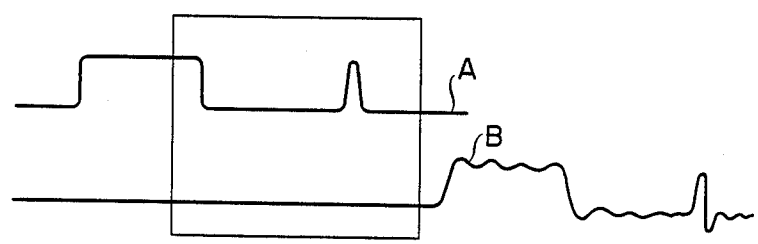
Figure 3C:
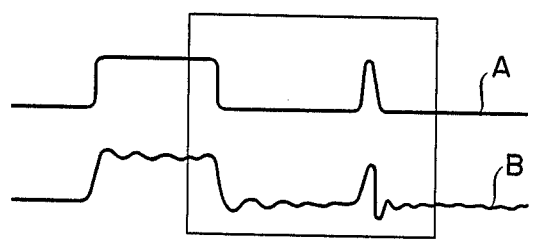
Figure 3D:
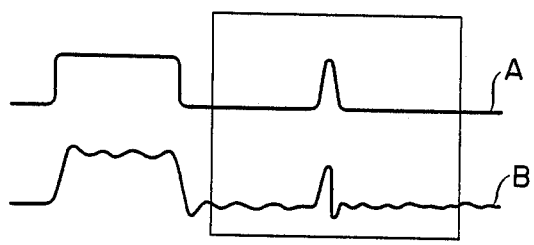
Figure 4:
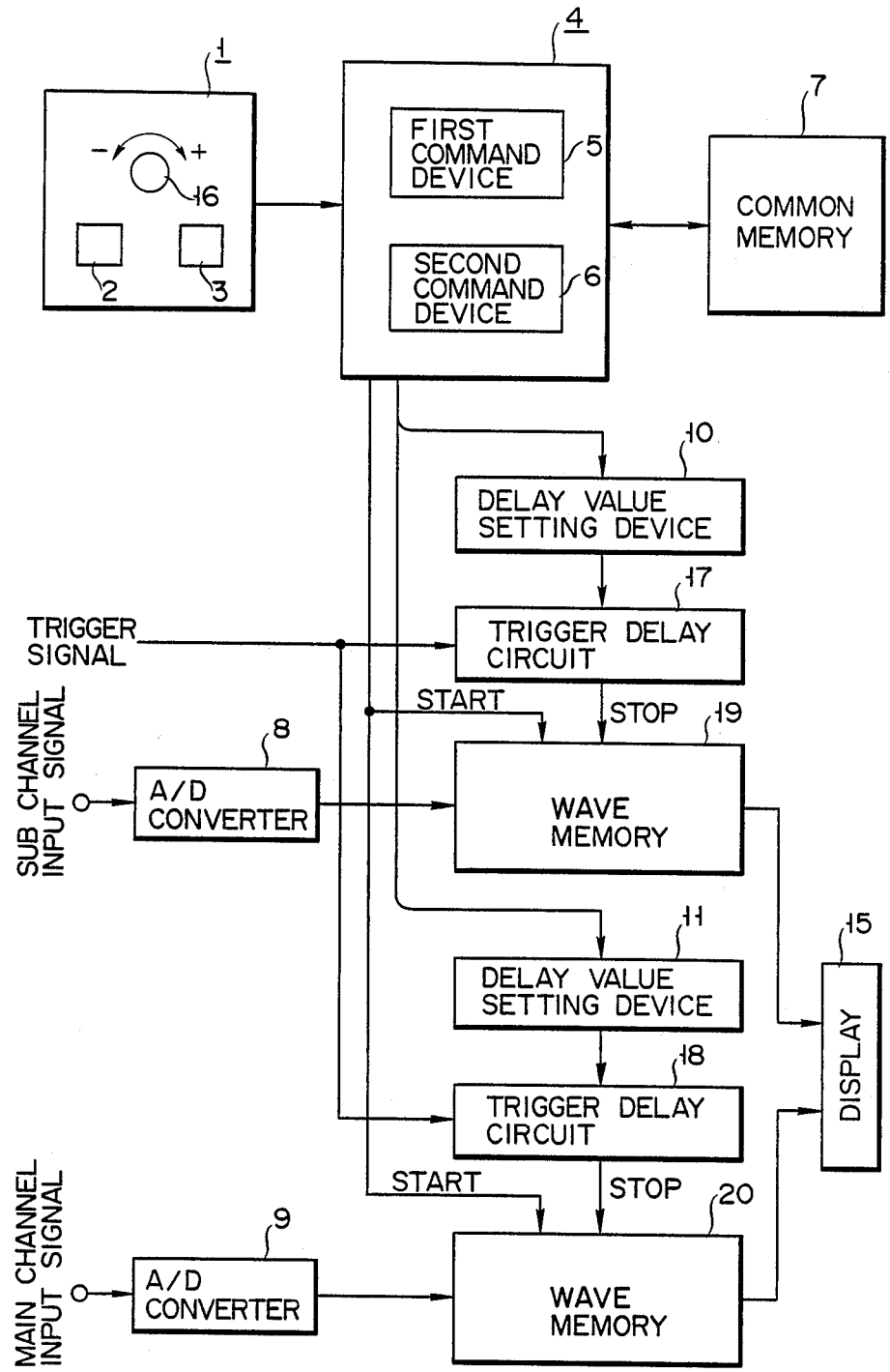
FIG. 4 is a block diagram of a digital wave observation apparatus according to another embodiment of the present invention.

FIG. 1 is a block diagram of a digital oscilloscope as a digital wave observation apparatus according to an embodiment of the present invention. FIG. 2 is a flow chart for explaining the operation of the apparatus of FIG. 1. FIGS. 3(A) to 3(D) are respectively charts for explaining wave translation along the time base. FIG. 4 is a block diagram of a digital wave observation apparatus according to another embodiment of the present invention.

Referring to FIG. 1, a delay operation panel 1 has a main switch 2 for designating a delay of a main channel, a sub switch 3 for designating a delay of a sub channel, and a dial 16 for designating delay values of both channels. When an operator depresses the switch 3 and sets the dial 16 at a desired position corresponding to a desired delay value D1, the sub switch information and code data el corresponding to the delay value D1 are supplied from the panel 1 to a microprocessor 4. However, when the operator depresses the switch 2 and sets the dial 16 at a desired position corresponding to a desired delay value D2, the main switch information and code data e2 corresponding to the delay value D2 are supplied from the panel 1 to the microprocessor 4. The microprocessor 4 has a function for first and second command devices 5 and 6. The function of the device 5 is effected in the following manner when the switch 3 in the panel 1 is depressed. When the microprocessor 4 receives the sub switch information and the code data el, previous data S stored in the sub area in a common memory 7 is read out and is added to the new code data from the panel 1. Sum data (S+el) is transferred to a delay value setting device 10 and the memory 7. The data S stored in the sub area of the memory 4 is updated to the new data (S+el) transferred from the microprocessor 4. When the microprocessor 4 accesses the corresponding sub area, the data (S+el) serves as the data S in the next updating cycle.

The function of the device 6 is effected in the following manner when the switch 2 in the panel 1 is depressed. When the microprocessor 4 receives the main switch information and the code data e2, previous data M is read out from a main area of the memory 7. At the same time, the previous data S is read out from the sub area of the memory 7. The data M and S are added to the new code data e2 from the panel 1, respectively, to obtain sum data (M+e2) and (S+e2). These sum data are transferred to the device 10 and the memory 7. The data M in the main area of the memory 7 and the data S in the sub area thereof are updated to the new data (M+e2) and (S+e2) from the microprocessor 4, respectively. When the microprocessor 4 sequentially accesses the main and sub areas of the memory 7, the data (M+e2) and (S+e2) serve as the data M and S in the next updating cycle.

An input signal of the sub channel is converted by an A/D converter 8 to a digital signal. The digital signal is delayed by a delay circuit 12. A delay value of the signal from the circuit 12 is determined by data set in the device 10. The data set in the device 20 is transferred from the microprocessor 4.

Similarly, an input signal of the main channel is converted by an A/D converter 9 to a digital signal. The digital signal is delayed by a delay circuit 13. A delay value of the signal from the circuit 13 is determined by data set in a delay value setting device 11. The data set in the device 11 is transferred from the microprocessor 4.

When the operator depresses the switch 3 in the panel 1, the function of the device 5 is effected, and only the data (S +el) is set in the device 10. Therefore, the input signal of the sub channel is delayed with respect to the input signal of the main channel, and the signals of the main and sub channels are stored in a wave memory 14. When the signals of the two channels which are stored in the memory 14 are read out and displayed on a display 15, the input signal of the sub channel is shifted by the delay value preset by the dial 16 in the panel 1, as compared with the input signal of the main channel.

However, when the operator depresses the switch 2 in the panel 1, the function of the device 6 of the microprocessor 4 is effected, and the data (S +e2) and (M +e2) are set in the devices 10 and 11, respectively. Therefore, the input signals of the two channels are simultaneously delayed by the same delay value while the relative delay relationship therebetween is kept unchanged. The simultaneously delayed signals are then stored in the memory 14. When waveforms of these signals are displayed on the display 15, the input signals of the main and sub channels are delayed by the same delay value preset by the dial 16 in the display 15.

The operation of the apparatus shown in FIG. 1 will be described with reference to a flow chart of FIG. 2.

Since an encoder is interlocked with the dial 16, a change in setting position of the dial 16 is detected as a variation in output from the encoder. When an encoder variation is detected (step 21), a variation in the encoder and the switch information from the switch 2 or 3 are read (step 22). The microprocessor 4 checks in step 23 whether or not the switch information represents sub switch information. If YES in step 23, the microprocessor 4 reads out the previous data S from the sub area in the memory 7 and adds the data S to the code data el from the encoder in step 24. The sum data (S+el) is set in the sub delay value setting device 10 (step 25). The delay value corresponding to the data (S +el) set in the device 10 is added by the circuit 12 to the digital input signal converted by the converter 8. An output from the circuit 12 is supplied to the memory 14. When the signal stored in the memory 14 is displayed on the display 15, the input signal B of the subchannel is translated (shifted) from a state of FIG. 3(B) to a state of FIG. 3(C).

If NO in step 23, i.e., when the microprocessor 4 determines that the switch information is the main switch information, the microprocessor 4 reads out the previous data S and M from the sub and main areas in the memory 7, and the code data e2 (the data may be el when the variation in the encoder is the same as in the case of sub switch information) is added to each of the data S and M in step 26. The sum data (S+e2) and (M+e2) are set in the devices 10 and 11 in step 27, respectively. The circuit 12 adds the delay value corresponding to the data (S+e2) set in the device 10 to the input signal of the sub channel which is converted by the converter 8. Similarly, the circuit 13 adds the delay value corresponding to the data (M+e2) set in the device 11 to the input signal of the main channel which is converted by the converter 9. Output signals from the circuits 12 and 13 are stored in the corresponding memory areas in the memory 14. When the storage contents are read out from the memory 14 and are displayed on the display 15, the input signals are delayed by the common delay value preset by the dial 16 in the panel 1. Therefore, the waveforms of the input signals A and B are shifted from the state of FIGS. 3(A) to 3(B) or FIGS. 3(C) to 3(D) while the relative phase difference between the signals A and B is kept unchanged.

FIG. 4 is a block diagram of a digital oscilloscope according to another embodiment of the present invention. A delay operation panel 1, a main switch 2, a sub switch 3, a dial 16, a microprocessor 4, a first command device 5, a second command device 6, a common memory 7, A/D converters 8 and 9, delay value setting devices 10 and 11, and a display 15 of the oscilloscope of this embodiment are the same as those of FIG. 1, and a detailed description thereof will be omitted.

Reference numerals 17 and 18 denote trigger delay circuits, respectively; and 19 and 20, memories, respectively. The circuits 17 and 18 delay trigger signals in accordance with the delay values supplied from the devices 10 and 11, respectively. The delayed trigger signals are used as stop signals to the memories 19 and 20. The memories 19 and 20 store the digital signals from the converters 8 and 9, respectively. The operation of the memories 19 and 20 is controlled by a start signal from the microprocessor 4 and the stop signals from the circuits 17 and 18.

When the start signal is generated to cause the microprocessor 4 to fetch data, the memories 19 and 20 receive the digital signals from the converters 8 and 9, respectively, and store and update the signals corresponding to the memory capacities, respectively.

When a trigger signal is input to the oscillator, it is delayed by the circuits 17 and 18, and outputs from the circuits 17 and 18 are supplied as the stop signals to the memories 19 and 20, respectively, thereby immediately interrupting the operation of the memories 19 and 20. In this case, the memories 19 and 20 store the previous data prior to the stop signals. When the wave data are read out from the memories 19 and 20 and are supplied to the display 15, the waveforms delayed by the delay values set in the devices 10 and 11 are displayed thereon. The data set in the devices 10 and 11 are supplied from the microprocessor 4, as described with reference to FIG. 1. The translation of the input signals A and B of the main and sub channels is performed in the same manner as in FIG. 1.

The two embodiments described above exemplify digital oscilloscopes each having the main and sub channels. However, the present invention can also be applied to an oscilloscope having at least three channels. In this case, the A/D converter, the delay value setting device and the delay circuit are provided in units of channels. Alternatively, the A/D converter, the delay value setting device, the trigger delay circuit and the memory can be provided in units of channels, as shown in FIG. 4. The following operation can be performed.

(I) A plurality of sub channels are provided. A switch corresponding to the sub switch 3 and a command device corresponding to the first command device 5 are arranged in units of sub channels. The delay of each sub channel is varied independently of the main channel and other sub channels.

When the main switch 2 is depressed, all the main and sub channel input signals are simultaneously shifted.

(II) When a plurality of sub channels are provided and a given sub channel switch is depressed, the signals of all the sub channels are commonly shifted by the first command device corresponding to the sub channel switch.

When the main switch 2 is depressed, all the main and sub channel input signals are simultaneously shifted.
(III) When a plurality of main channels are provided and a given main switch is depressed, the signals of all the main channels are commonly shifted by the second command device of the corresponding main channel switch together with the signal of the sub channel.

As is apparent from the above description, the relative and absolute delay relationships between the channels can be independently controlled.

The present invention is not limited to the particular embodiment described above. Various changes and modifications may be made within the spirit and scope of the invention. For example, the present invention can also be applied to various types of equipment such as digital storage oscilloscopes, waveform recorders, FFT analyzers and waveform analyzers, all adapting the digital signal processing techniques.

What is claimed is:

1. A digital wave observation apparatus, comprising:
    first and second analog-to-digital (A/D) converters for converting input signals of associated first and second channels into corresponding first and second digital signals;
    first and second delay circuits for selectively delaying the first and the second digital signals from said first and said second A/D converters;
    wave memory means for storing output signals from said first and said second delay circuits;
    display means for displaying the output signals stored in said wave memory means;
    delay channel designating means for supplying channel designating data to designate which channel of said first and said second channels is to be delayed;
    delay value setting means operatively associated with said delay channel designating means, for supplying desired delay value setting data;
    a first command device for receiving channel designating data corresponding to said first channel from said delay channel designating means and the desired delay value setting data from said delay value setting means, and for performing a predetermined calculation to produce first delay data;
    a first delay value setting device coupled to said first delay circuit for receiving the first delay data from said first command device and for setting a delay value of said first delay circuit to a value corresponding to the first delay data;
    a second command device for receiving the channel designating data corresponding to said second channel from said delay channel designating means and the desired delay value setting data from said delay value setting means, and for performing a predetermined calculation to produce second delay data, said second command device being coupled to said first delay value setting device; and
    a second delay value setting device coupled to said second delay circuit and said second command service, for receiving the second delay data from said second command device and for setting a delay value of said second delay circuit to a value corresponding to the second delay data; and
    wherein said first delay value setting device receives the second delay data from said second command device and sets a delay value of said first delay circuit also to a value corresponding to the second delay data.

2. The digital wave observation apparatus according to claim 1, comprising delay data memory means for storing the first and the second delay from said first and said second command devices, and said first and said second command devices each include means for adding at least one of first delay data and second delay data previously stored in said delay data memory means, to the desired delay value setting data produced by said delay value setting means to output at least one of new first delay data and new second delay data.

3. The digital wave observation apparatus according to claim 1, including a plurality of first A/D converters and a plurality of associated first delay circuits each with an associated first delay value setting device coupled to said first command device for forming a plurality of first channels.

4. The digital wave observation apparatus according to claim 3, including means for setting delay values for each of said plurality of first channels relative to one another and independently of said second channel;

5. The digital wave observation apparatus according to claim 3, including means for setting delay values for each of said plurality of first channels relative to one another and in common with said second channel.

6. The digital wave observation apparatus according to claim 3, including a plurality of second A/D converters and a plurality of associated second delay circuits each with an associated second delay value setting device coupled to said second command device for forming a plurality of second channels.

* * * * *